United States Patent [19]

Urbanski

[11] Patent Number: 5,666,429

[45] Date of Patent: Sep. 9, 1997

[54] ENERGY ESTIMATOR AND METHOD THEREFOR

[75] Inventor: Steven Adam Urbanski, Round Lake Beach, Ill.

[73] Assignee: Motorola, Inc., Schaumburg, Ill.

[21] Appl. No.: 276,736

[22] Filed: Jul. 18, 1994

[51] Int. Cl.$^6$ .................................................. H04B 15/00
[52] U.S. Cl. ............................................................ 381/94.1
[58] Field of Search .................................. 381/94, 13, 47, 381/71, 93, 83; 455/222, 223, 226, 226.3, 296; 395/2.35; 364/724.1

[56] References Cited

U.S. PATENT DOCUMENTS

| | | |
|---|---|---|
| 4,491,701 | 1/1985 | Duttweiler et al. ................ 381/101 |
| 4,630,305 | 12/1986 | Borth et al. ........................ 381/94 |
| 4,811,404 | 3/1989 | Vilmur et al. ...................... 381/94 |
| 5,027,410 | 6/1991 | Williamson et al. ............... 381/68.4 |
| 5,150,384 | 9/1992 | Cahill ................................. 455/260 |
| 5,544,250 | 8/1996 | Urbanski ............................ 381/94 |
| 5,608,804 | 3/1997 | Hirano ............................... 381/94 |

*Primary Examiner*—Curtis Kuntz
*Assistant Examiner*—Xu Mei
*Attorney, Agent, or Firm*—Kevin D. Kaschke

[57] ABSTRACT

An energy estimator (223) and method therefor decimates (401) a signal (211) to produce a decimated signal (411); rectifies (403) the decimated signal (411) to produce a full wave rectified signal (413); averages (405) the full wave rectified signal (413) over a predetermined time period to produce an averaged signal (415); applies a logarithmic function (407) to the averaged signal (415) to produce a logarithmic signal (417); and filters (409) the logarithmic signal (417) to produce an energy estimate (229) of the signal (211). The energy estimator (223) and method therefor advantageously reduces complexity while improving performance over those energy estimators of the prior art.

4 Claims, 9 Drawing Sheets

223

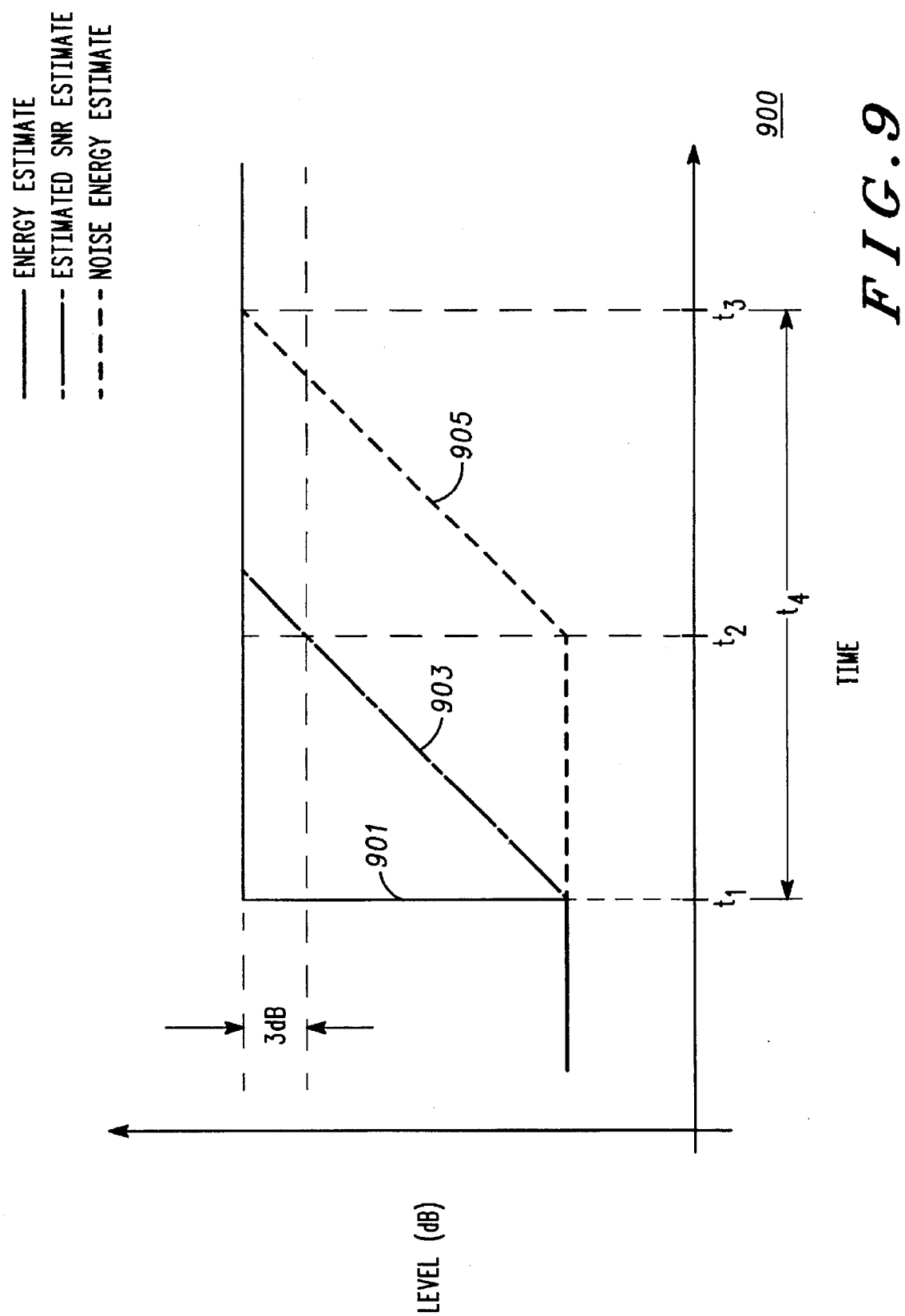

ENERGY ESTIMATOR AND METHOD THEREFOR

FIELD OF THE INVENTION

The present invention relates generally to audio signal processing and, more particularly, to an energy estimator and method therefor used when processing audio signals.

BACKGROUND OF THE INVENTION

Audio signal processors typically process audio signals to modify characteristics of the audio signals. Typical applications of audio signal processors include filtering, speech compression, echo cancelling, noise suppression and energy estimation. Audio signal processors are frequently used in communication systems for processing speech. Audio signal processors advantageously provides improved audio quality, and efficient transmission and storage of speech.

Acoustic noise suppression in a speech communication system generally serves the purpose of improving the overall quality of the desired audio signal by filtering environmental background noise from the desired speech signal. This speech enhancement process is particularly necessary in environments having abnormally high levels of ambient background noise, such as an aircraft, a moving vehicle, or a noisy factory.

One noise suppression technique is a spectral subtraction—or a spectral gain modification—technique. Using this approach, the audio input signal is divided into individual spectral bands by a bank of bandpass filters, and particular spectral bands are attenuated according to their noise energy content. A spectral subtraction noise suppression prefilter utilizes an estimate of the background noise power spectral density to generate a signal-to-noise ratio (SNR) of the speech in each channel, which, in turn, is used to compute a gain factor for each individual channel. The gain factor is used as the attenuation for that particular spectral band. The channels are then attenuated and recombined to produce the noise-suppressed output waveform.

In specialized applications involving relatively high background noise environments, most noise suppression techniques exhibit significant performance limitations. One example of such an application is the vehicle speakerphone option to a cellular mobile radio telephone system, which provides hands-free operation for the automobile driver. The mobile hands-free microphone is typically located at a greater distance from the user, such as being mounted overhead on the visor. The more distant microphone delivers a much poorer signal-to-noise ratio to the land-end party due to road and wind noise conditions. Although the received speech at the land-end is usually intelligible, continuous exposure to such background noise levels often increases listener fatigue.

In rapidly-changing high noise environments, a severe low frequency noise flutter develops in the output speech signal which resembles a distant "jet engine roar" sound. This noise flutter is inherent in a spectral subtraction noise suppression system, since the individual channel gain parameters are continuously being updated in response to the changing background noise environment.

The background noise flutter problem was indirectly addressed but not eliminated through the use of gain smoothing. Unfortunately, excessive gain smoothing still produces noticeable detrimental effects in voice quality, the primary effect being the apparent introduction of a tail-end echo or "noise pump" to spoken words. There is also significant reduction in voice amplitude with large amounts of gain smoothing.

The noise flutter performance was further improved by the technique of smoothing the noise suppression gain factors for each individual channel on a per-sample basis instead of on a per-frame basis. However, this technique did not appreciate that the primary source of the channel gain discontinuities is the inherent fluctuation of background noise in each channel from one frame to the next. In known spectral subtraction systems, even a 2 dB SNR variation would create a few dB of gain variation, which is then heard as an annoying background noise flutter.

U.S. Pat. No. 4,811,404 addressed the noise flutter problem with an improved noise suppression system which performs speech quality enhancement upon the speech-plus-noise signal available at the input to generate a clean speech signal at the output by spectral gain modification. The improvements included the addition of a signal-to-noise ratio (SNR) threshold mechanism to reduce background noise flutter by offsetting the gain rise of the gain tables until a certain SNR threshold is reached, the use of a voice metric calculator to produce a more accurate background noise estimates via performing the update decision based on the overall voice-like characteristics in the channels and the time interval since the last update, and the use of a channel SNR modifier to provide immunity to narrow band noise bursts through modification of the SNR estimates based on the voice metric calculation and the channel energies.

However, the solution proposed by U.S. Pat. No. 4,811,404 introduces a trade-off between voice quality and noise suppression. When the gain rise has a relatively low offset, the noise suppression is improved but the voice quality is degraded. When the gain rise has a relatively high offset, the noise suppression is degraded but the voice quality is improved.

Moreover, energy estimators estimate the energy in a signal. The energy estimate of the signal is typically used in audio signal processors. Typical applications of the energy estimate in signal processors includes signal detection, noise estimation, and signal to noise ratio estimation.

A common problem in estimating the energy of a noise signal is that the variance of the energy estimate from one estimate to another is large.

One solution to the problem involves filtering the energy estimate. However, using filters to achieve acceptable variance of the energy estimate when estimating noise are generally complicated in that they perform computationally intensive steps.

Another solution to the problem involves estimating the energy of the signal over long periods of time. However, the response time of this technique is slow.

Accordingly, there is a need for an improved energy estimator and method therefor which addresses the problem of estimating the energy of a noise signal in the prior art.

BRIEF DESCRIPTION OF THE DRAWINGS

FIG. 9 illustrates a graph showing the response time of an estimated SNR estimate and a noise energy estimate to a positive unit step function in an energy estimate of FIG. 2, in accordance with the present invention.

SUMMARY OF THE INVENTION

In accordance with the present invention, the foregoing need is substantially met by an energy estimator and method therefor. The energy estimator comprises a full wave rectifier, an averager, a logarithmic function determiner, and a filter. The full wave rectifier, operatively coupled to receive a signal, rectifies the signal to produce a full wave rectified signal. The averager, operatively coupled to the full wave rectifier, averages the full wave rectified signal over a predetermined time period to produce an averaged signal. The logarithmic function determiner, operatively coupled to the averager, produces a logarithmic signal responsive to applying a logarithmic function to the averaged signal. The filter, operatively coupled to the logarithmic function determiner, filters the logarithmic signal to produce an energy estimate of the signal. The energy estimator and method therefor advantageously reduces complexity while improving performance over those energy estimators of the prior art.

Alternatively, the energy estimator comprises a decimator, operatively coupled to receive the signal, for decimating the signal to produce a decimated signal. The full wave rectifier, operatively coupled to the decimator, rectifies the decimated signal to produce the full wave rectified signal.

DETAILED DESCRIPTION OF A PREFERRED EMBODIMENT

Figure 1:
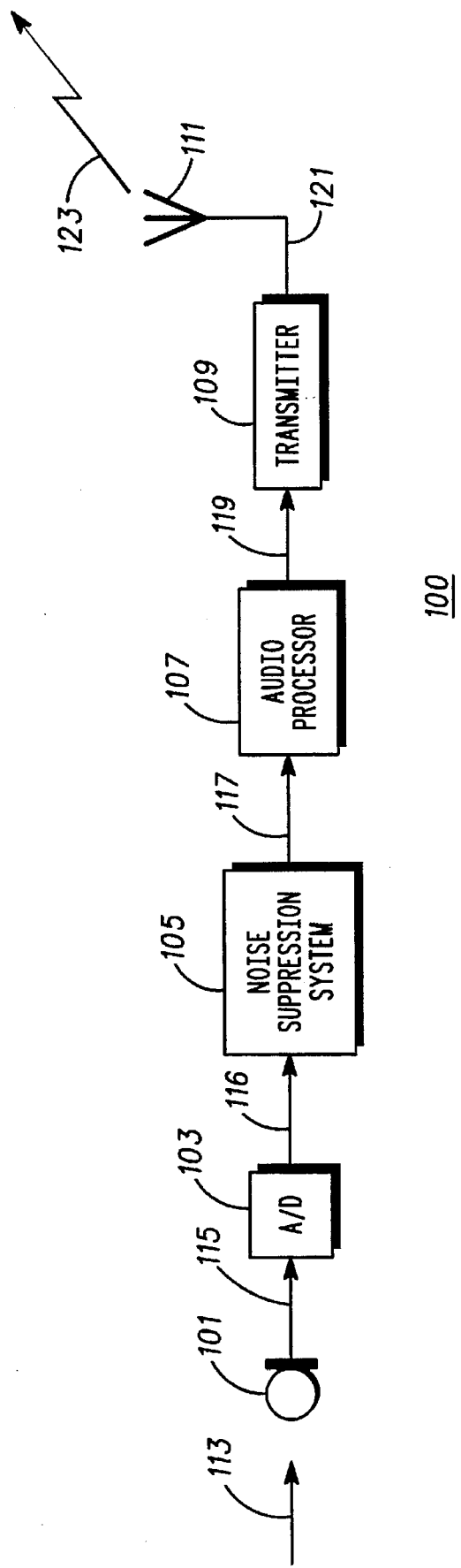
FIG. 1 illustrates a block diagram of a communication unit in accordance with the present invention.

FIG. 1 illustrates a block diagram of a communication unit 100 in accordance with the present invention. The communication unit 100 generally comprises a microphone 101, an analog to digital (A/D) converter 103, a noise suppression system 105, an audio processor 107, a transmitter 109, and an antenna 111. The noise suppression system and method therefor will be described in further detail with reference to FIGS. 2 through 9.

The microphone 101 is coupled to receive an input signal 113, in acoustic form, to produce the input signal in electric form at line 115. The A/D converter 103, operatively coupled to the microphone 101, converts the input signal in electric form at line 115 to a digital signal at line 116. The noise suppression system 105, operatively coupled to the A/D converter 103, produces a noise suppressed signal at line 117 responsive to the input signal at line 116. The audio signal processor 107, operatively coupled to the noise suppression system 105, produces a processed signal at line 119 responsive to the noise suppressed signal at line 117. The transmitter 109, operatively coupled to the audio processor 107, transmits the processed signal at line 119 to produce a transmitted signal in electric form at line 121. The antenna 111, operatively coupled to the transmitter 109, converts the transmitted signal in electric form at line 121 to a transmitted signal in electromagnetic form as represented by reference number 123.

The communication unit 100 is preferably a cellular radiotelephone. For example, the cellular radiotelephone may be a digital cellular radiotelephone, such as used in the North American Digital Cellular (NADC) System; the Japan Digital Cellular (JDC) System; or the Group Special Mobile (GSM) System. Alternatively, the communication unit 100 may be a two-way radio, cordless radiotelephone, or a wireless microphone.

The input signal 113 is preferably speech, producing a signal in the audio band generally known as 300 Hz to 3 KHz. However, noise signals are typically included with the input signal 113 either during speech or between speech.

The A/D converter 103 preferably samples the input signal at line 115 at an 8 kHz rate. One frame of the input signal at line 115 sampled at the 8 kHz rate is chosen to include 160 consecutive samples of the input signal at line 115. Therefore, one frame of the input signal at line 115 is produced every 20 msec (160 samples/8000 samples per second).

The microphone, the audio processor, the transmitter, and the antenna are each well known in the art, and thus no further description will be provided except to facilitate the understanding of the present invention.

Figure 2:
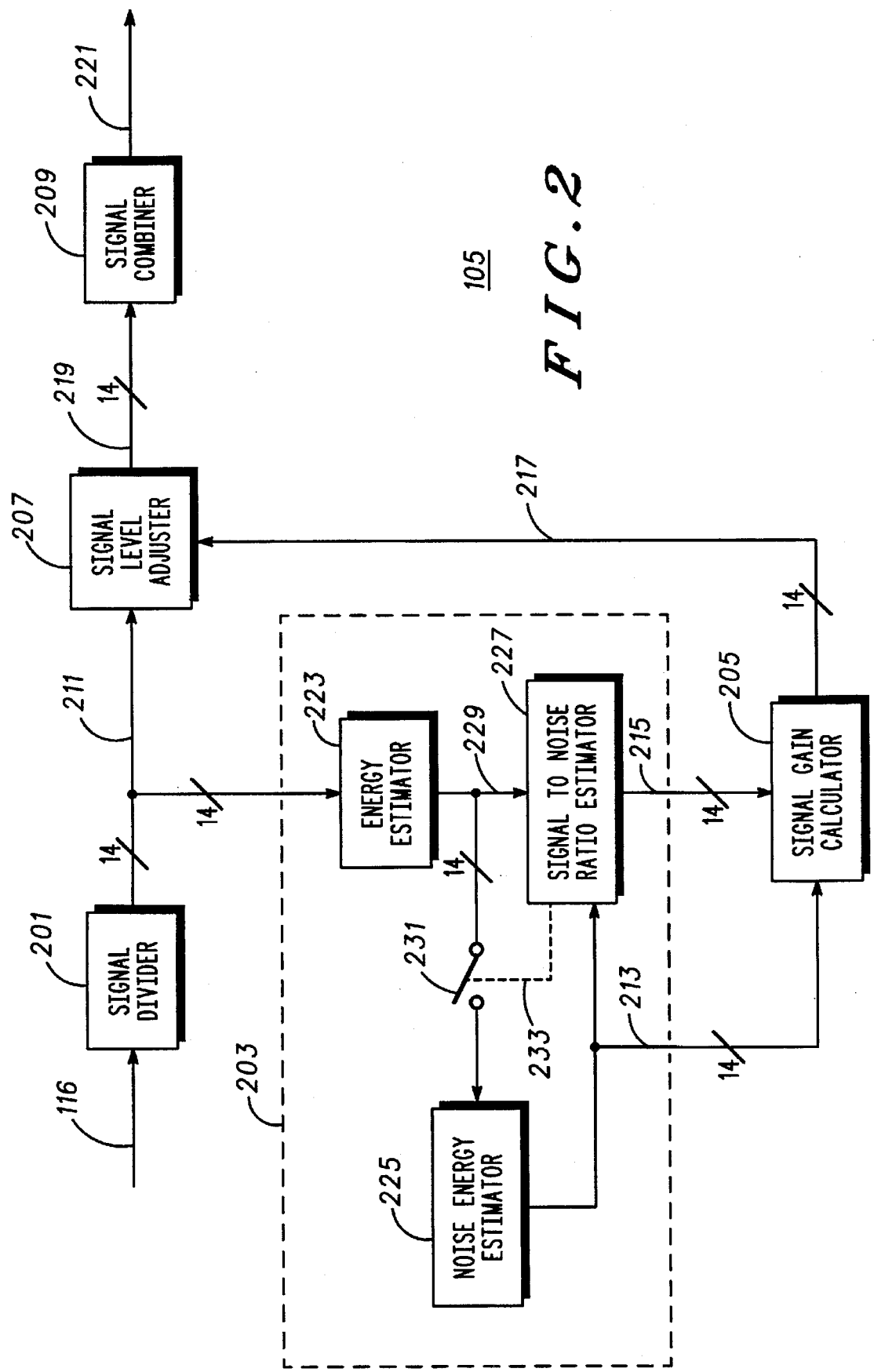
FIG. 2 illustrates a block diagram of a noise suppression system of the communication unit of FIG. 1 in accordance with the present invention.

FIG. 2 illustrates a block diagram of the noise suppression system 105 of the communication unit 100 of FIG. 1 in accordance with the present invention. The noise suppression system 105 comprises a signal divider 201, a signal estimator 203, a signal gain calculator 205, a signal level adjustor 207, and a signal combiner 209. The signal estimator 203 further comprises an energy estimator 223, a noise energy estimator 225, and a signal to noise ratio (SNR) estimator 227.

The signal divider 201 will be described in further detail with reference to FIG. 3. The energy estimator 223 will be described in further detail with reference to FIGS. 4, 5 and 6. The signal gain calculator 205 will be described in further detail with reference to FIG. 7. A method for suppressing noise performed by the noise suppression system 105 will be described in further detail with reference to FIG. 8. The signal to noise energy estimator 227 and the noise energy estimator 225 will be described in further detail with reference to FIG. 9.

In general, the signal divider 201, operatively coupled to receive the input signal at line 116, divides an input signal at line 116 to produce a plurality of divided signals at line 211 corresponding to a plurality of frequency bands. The signal estimator 203, operatively coupled to the signal divider 201, produces a plurality of noise energy estimates at line 213 corresponding to the plurality of divided signals at line 211 and a plurality of signal to noise ratio (SNR) estimates at line 215 corresponding to the plurality of divided signals at line 211. The signal gain calculator 205, operatively coupled to the signal estimator 203, calculates a plurality of gain values at line 217 corresponding to the plurality of divided signals at line 211 responsive to the plurality of noise energy estimates at line 213, respectively, and the plurality of SNR estimates at line 215, respectively. The signal level adjuster 207, operatively coupled to the signal gain calculator 205 and the signal divider 201, adjusts the level of the plurality of divided signals at line 211 to produce a plurality of adjusted signals at line 219, respectively, responsive to the plurality of gain values at line 217, respectively. The signal combiner 209, operatively coupled the signal level adjuster 207, combines the plurality of adjusted signals at line 219 to produce an output signal at line 221 having suppressed noise.

The noise suppression system 105 is preferably performed by a digital signal processor such as a Motorola 56166. However, the noise suppression system 105 may also be implemented in hardware if so desired.

The energy estimator 223, operatively coupled to the signal divider 201, produces a plurality of energy estimates at line 229 corresponding to the plurality of divided signals at line 211. The noise energy estimator 225, operatively coupled to the signal divider 201, produces a plurality of noise energy estimates at line 213 corresponding to the plurality of divided signals at line 211. The signal to noise ratio (SNR) estimator 227, operatively coupled to the energy estimator 223 and the noise energy estimator 225, produces a plurality of SNR estimates at line 215 corresponding to the plurality of divided signals at line 211 responsive to the plurality of energy estimates at line 229, respectively, and the plurality of noise energy estimates at line 213, respectively.

In the preferred embodiment, a switch 231 is operatively coupled between the energy estimator 223 and the noise energy estimator 225. The signal to noise ratio estimator 227 selectively controls the switch 231 via control line 233 to provide an updated energy estimate at line 229 to the noise energy estimator 225.

For each frame of the input signal at line 115, the signal to noise ratio estimator 227 produces a current SNR estimate (SNR) at line 215 by dividing the energy of the frame at line 229 by the noise energy estimate of the frame at line 213. Additionally, the signal to noise ratio estimator 227 produces an estimated SNR estimate (SÑR) based on the following update equation:

$$\hat{SNR} = \begin{matrix} \hat{SNR} + SN\_EST\_INC & \text{for } \hat{SNR} < SNR \\ SNR & \text{for } \hat{SNR} \geq SNR \end{matrix}$$

SN_EST_INC is a variable of the equation. The value for SN_EST_INC is preferably chosen to be 0.125 dB. This value is chosen to provide optimal tracking of the current SNR estimate (SNR) when the current SNR estimate (SNR) at line 215 is changing quickly or slowly. Other values may alternatively be chosen for other noise suppression systems. Therefore, the estimated SNR estimate (SÑR) tracks, i.e., updates or adjusts to, the current SNR estimate (SNR) at a rate of 6.25 dB per second (0.125 dB/20 msec.).

The signal to noise ratio estimator 223 controls the switch responsive to the current SNR estimate (SNR) at line 215, the estimated SNR estimate (SÑR), and a predetermined threshold (SN_EST_THR) according to the following equation:

$$SNR < \hat{SNR} + SN\_EST\_THR$$

The value of SN_EST_THR is preferably 3 dB. When the current SNR estimate (SNR) of the frame at line 215 is greater than or equal to 3 dB above the estimated SNR estimate (SÑR), the signal to noise ratio estimator 227 assumes that speech is present. Therefore, the signal to noise ratio estimator 227 opens the switch 231 so that the noise energy estimate at line 213 will not be updated by the noise energy estimator 225. This advantageously prevents the noise energy estimate of the frame at line 213 from updating during periods when the input signal at line 115 comprises speech. When the current SNR estimate (SNR) of the frame at line 215 is less than 3 dB above the estimated SNR estimate (SÑR), the signal to noise ratio estimator 227 assumes that noise is present. Therefore, the signal to noise ratio estimator 227 closes the switch 231 so that the noise energy estimate at line 213 will be updated by the noise energy estimator 225. However, if the current SNR estimate (SNR) remains at a constant level after increasing 3 dB above the estimated SNR estimate (SÑR) for a predetermined period of time, the signal to noise ratio estimator 227 assumes that the noise floor of the input signal at line 211 has increased. Therefore, the signal to noise ratio estimator 227 will close the switch 231 via line 233 allowing the noise energy estimator 225 to update the noise energy estimate at line 213. Therefore the noise energy estimate at line 213 is resilient to sudden changes in the noise floor of the input signal, i.e., the larger the change in the noise floor of the input signal the longer it takes for the noise energy estimator 225 to update the noise energy estimate at line 213.

The noise energy estimator 225 updates the noise energy noise estimate (Ñ) according to the following equation:

$$\hat{N} = \begin{matrix} \hat{N} + RO\_NOISE\_INC & \text{for } SNR > 0 \text{ dB} \\ \text{Energy Estimate} & \text{for } SNR \leq 0 \text{ dB} \end{matrix}$$

RO_NOISE_INC is a variable in the equation. The value for RO_NOISE_INC is preferably 0.125 dB. This value is chosen to provide optimal tracking of the noise floor when the noise energy is changing quickly or slowly. Other values may alternatively be chosen for other noise suppression systems. During the times when the noise energy estimate (Ñ) is updated, the SNR>0 dB when the noise floor is greater than the noise energy estimate (Ñ), and the SNR<0 when the noise floor is less than or equal to the noise energy estimate (Ñ). Therefore, the noise energy estimate (Ñ) tracks, i.e. updates or adjusts to, the noise floor at a rate of 6.25 dB per second (0.125 dB/20 msec.).

FIG. 9 illustrates a graph 900 showing the response time of the estimated SNR estimate (SÑR) 903 and the noise energy estimate (Ñ) 905 to a positive unit step function in the energy estimate 901 at line 229, in accordance with the present invention. The graph 900 in FIG. 9 incorporates the equations used by the signal to noise ratio estimator 227 and the noise energy estimator 225 described above. At time, t1, the positive unit step function in the energy estimate 901 occurs and the estimated SNR estimate (SÑR) 903 begins tracking the energy estimate 901 at the rate of 6.25 dB/sec. At time, t2, when the estimated SNR estimate (SÑR) 903 comes within 3 dB of the energy estimate 901, the energy estimate 901 is assumed to be noise energy and the noise energy estimate (Ñ) 905 begins tracking the noise energy at the rate of 6.25 dB/sec. Therefore, the total time, t4 (t3−t1), for the noise energy estimate (Ñ) to adapt to the positive unit step function in the energy estimate 901 at line 229 is represented by the following equation:

$$r4 = \frac{\text{Energy Estimate} - \hat{SNR} - 3 \text{ dB}}{\frac{d(SN\_EST\_INC)}{dt}} +$$

$$\frac{\text{Energy Estimate} - \text{Noise Energy Estimate}}{\frac{d(RO\_NOISE\_INC)}{dt}}$$

wherein d(SN_EST_INC)/dt=6.25 dB/sec. (0.125 dB/20 ms) and d(RO_NOISE_INC)/dt=6.25 dB/sec. (0.125 dB/20 ms). This equation shows that the larger the change in the noise floor, the longer it will take the noise energy estimate ($\hat{N}$) to adapt.

The level adjuster and the signal combiner are each well known in the art, and thus no further description will be provided except to facilitate the understanding of the present invention.

Figure 3:
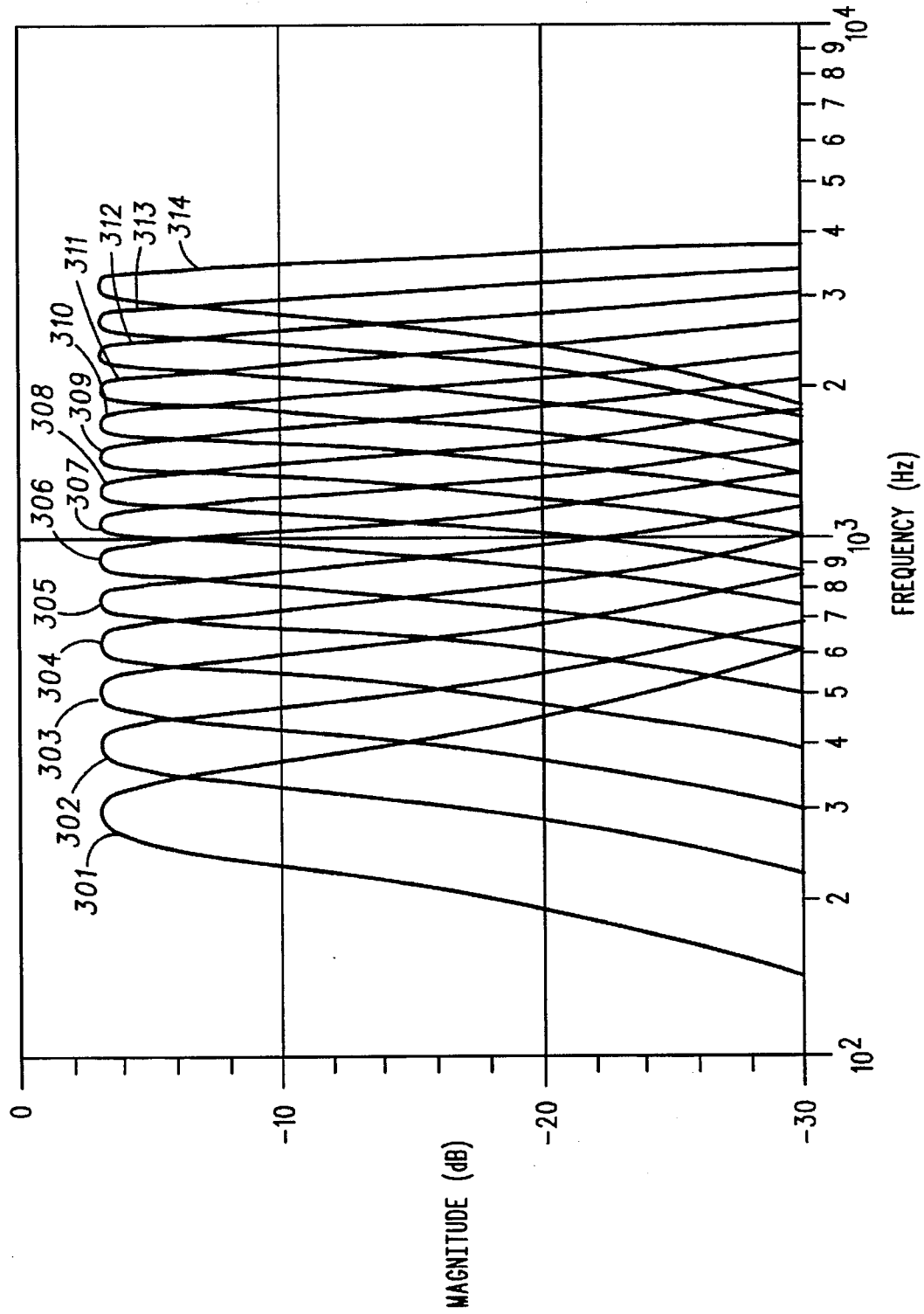
FIG. 3 illustrates a plurality of frequency bands used by a signal divider of FIG. 2 to divide an input signal into a plurality of divided signals corresponding to the plurality of frequency bands in accordance with the present invention.

FIG. 3 illustrates a plurality of frequency bands 301–314 used by a signal divider 201 of FIG. 2 to divide the input signal at line 116 into a plurality of divided signals at line 211 corresponding to the plurality of frequency bands 301–314 in accordance with the present invention. In the preferred embodiment, the signal divider 201 has fourteen frequency bands. The signal divider 201 is preferably a fourth order normalized lattice filter, as is well known in the art. Alternatively, the signal divider 201 can be a direct form one or direct form two filter structure, as is well known in the art.

Figure 4:
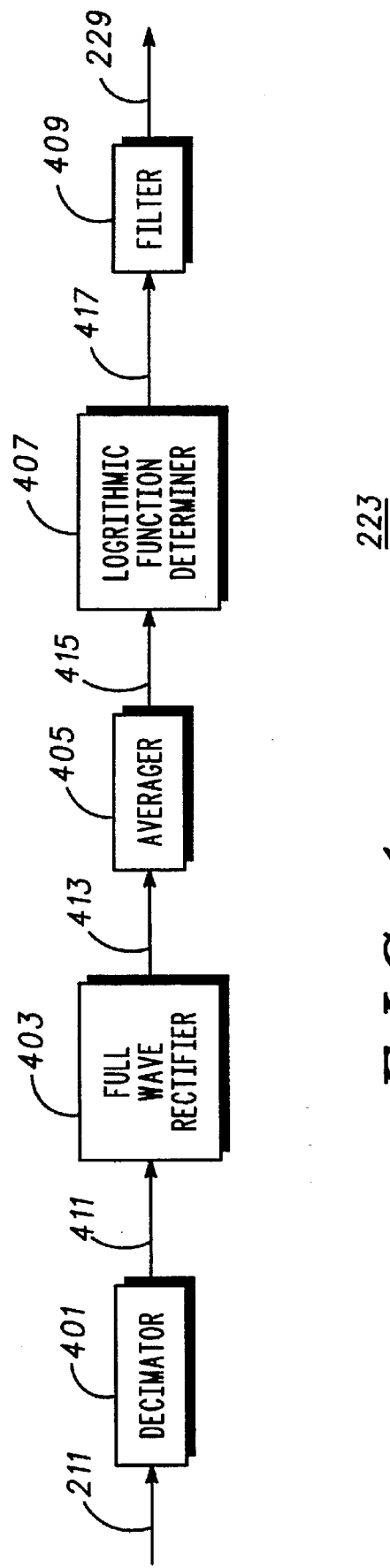
FIG. 4 illustrates a block diagram of an energy estimator of the noise suppression system of FIG. 2 in accordance with the present invention.
Figure 5:
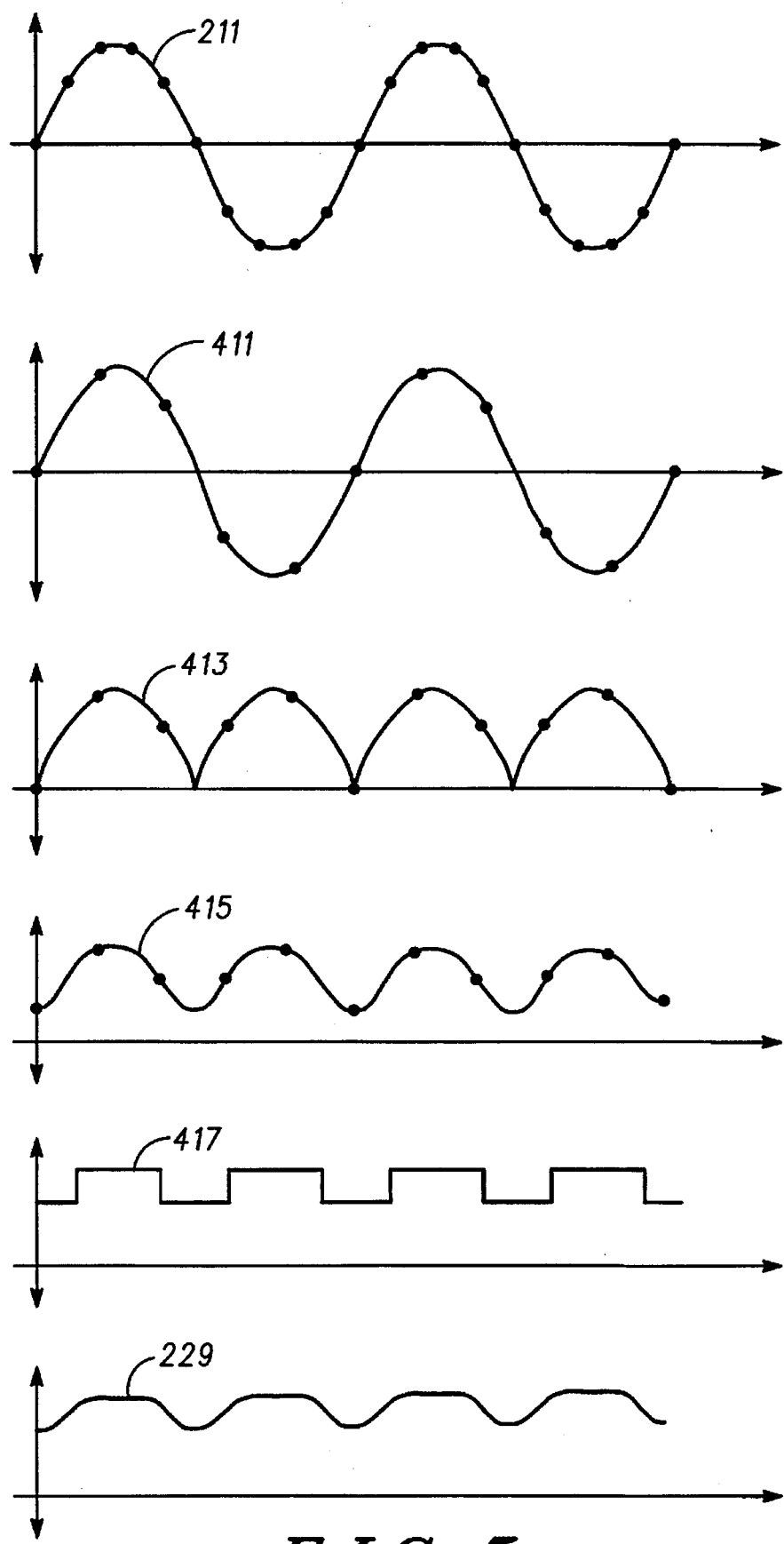
FIG. 5 illustrates a plurality of signals represented in the block diagram of the energy estimator of FIG. 4 in accordance with the present invention.

FIGS. 4 and 5 will be described together. FIG. 4 illustrates a block diagram of the energy estimator 223 of the noise suppression system 105 of FIG. 2 in accordance with the present invention. FIG. 5 illustrates a plurality of signals represented in the block diagram of the energy estimator of FIG. 4 in accordance with the present invention. The plurality of signals represented in FIG. 5 are magnified to more clearly show the function of the energy estimator 223.

The energy estimator 223 further comprises a decimator 401, a full wave rectifier 403, an averager 405, a logarithmic function determiner 407, and a filter 409. The decimator 401, operatively coupled to receive the input signal at line 211, decimates the input signal at line 116 to produce a decimated signal at line 411. The full wave rectifier 403, operatively coupled to the decimator 401, rectifies the decimated signal at line 411 to produce a full wave rectified signal at line 413. The averager 405, operatively coupled to the full wave rectifier 403, averages the full wave rectified signal at line 413 over a predetermined time period to produce an averaged signal 415. The logarithmic function determiner 407, operatively coupled to the averager 405, produces a logarithmic signal at line 417 responsive to applying a logarithmic function to the averaged signal at line 415. The filter 409, operatively coupled to the logarithmic function determiner 407, filters the logarithmic signal at line 417 to produce the energy estimate signal at line 229.

The purpose of the decimator 401 is to reduce the amount of computation performed by the full wave rectifier 403 and the averager 405 without degrading performance. Thus, the decimator is not a necessary element of the energy estimator 223 but an advantageous element. In the preferred embodiment, the decimator 401 removes samples from the frame (as shown in FIG. 5, signals 211 and 411) by selectively processing the input signal at line 211 of the plurality of frequency bands 301–314 according to the Nyquist Sampling Theorem. Frequency bands 301–304 are decimated by 4, since the frequency content of each frequency band 301–304 is less than 1 kHz. Frequency bands 305–308 are decimated by 2, since the frequency content of each frequency band 305–308 is less than 2 kHz. Frequency bands 309–314 are decimated by 1, since the frequency content of each frequency band 309–314 is less than 4 kHz.

The full wave rectifier 403 transforms the input signal having positive and negative values, at line 211 to the full wave rectified signal having only positive values as shown in FIG. 5.

The averager 405 determines the average level of the full wave rectified signal at line 413 over a time duration that is less than the frame rate as shown in FIG. 5. In the preferred embodiment, the average time duration is one-half the frame rate (10 msec.) to improve the response time of the energy estimate at line 229.

The logarithmic function determiner 407 reduces the dynamic range of the averaged signal at line 415 so that the variance of the averaged signal at line 415 is small. The logarithmic function determiner 407 is preferably a logarithmic function with a base of ten.

The filter 409 smoothes the logarithmic signal at line 417 to produce a smoothed energy estimate at line 229. The filter 409 is preferably a two tap low pass filter. In the preferred embodiment, the two tap low pass filter is implemented as an averager. Since the filter 409 filters the logarithmic signals at line 417, the filter 409 is extremely efficient in smoothing the energy estimate at line 229.

The energy estimator 223 of the present invention is advantageous over the energy estimator 220 of U.S. Pat. No. 4,811,404 because it is less complex. U.S. Pat. No. 4,811,404 uses a full wave rectifier and a double precision low pass filter. The reduction in complexity of the energy estimator 223 of the present invention is accomplished by replacing the double precision low pass filter with the averager 405, the logarithmic function determiner 407 and the filter 409 of the energy estimator 223.

Figure 6:
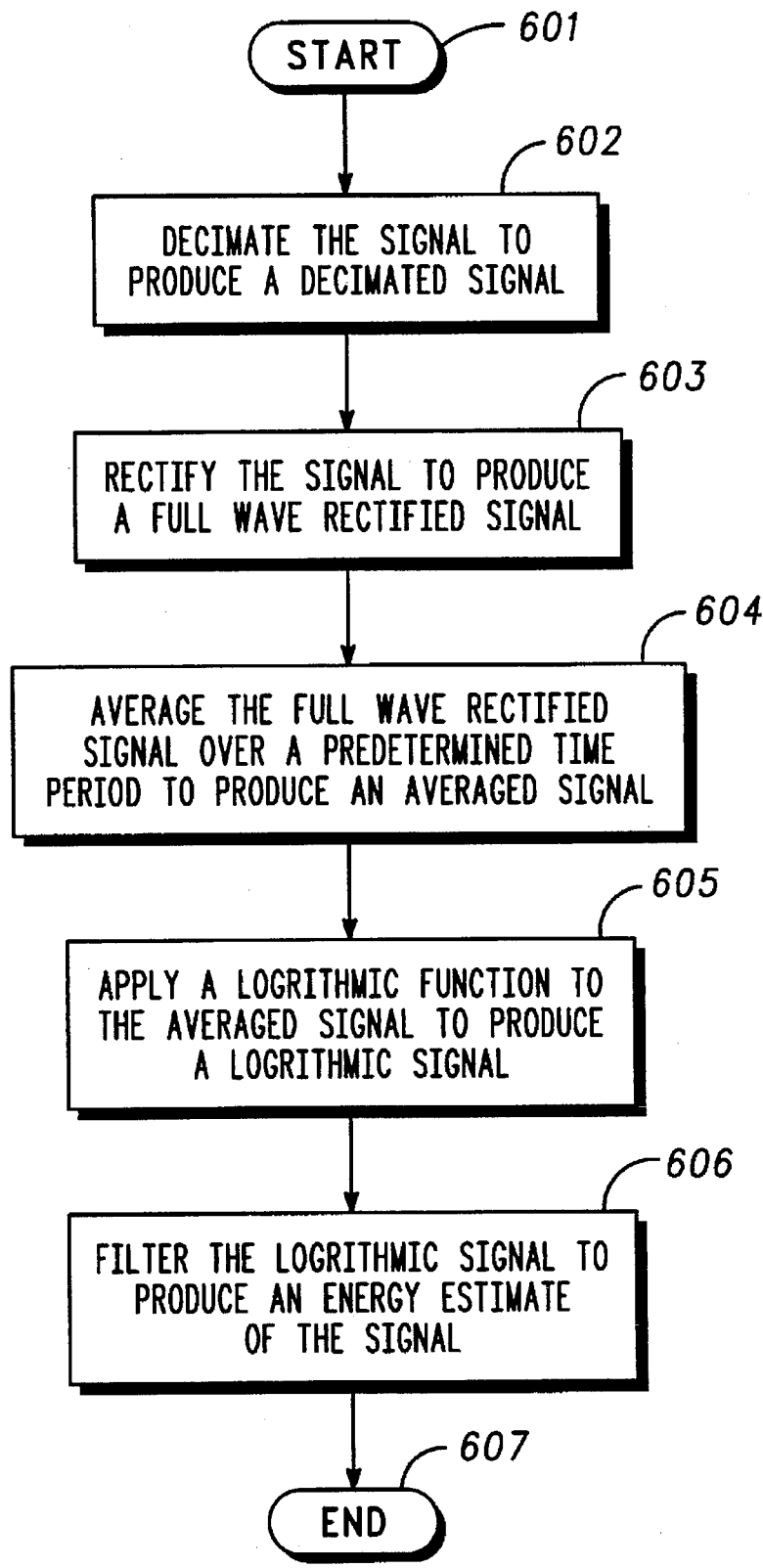
FIG. 6 illustrates a process flow diagram performed by the energy estimator of FIG. 4 in accordance with the present invention.

FIG. 6 illustrates a process flow diagram performed by the energy estimator 223 of FIG. 4 in accordance with the present invention. The process begins at step 601. At step 602, the decimator 401 decimates the input signal at line 211 to produce the decimated signal at line 411. At step 603, the full-wave rectifier 403 rectifies the decimated signal at line 411 to produce a full wave rectified signal at line 413. At step 604, the averager 405 averages the full wave rectified signal at line 413 over a predetermined time period to produce an averaged signal at line 415. At step 605, the logarithmic function determiner 407 applies a logarithmic function to the averaged signal at line 415 to produce a logarithmic signal at line 417. At step 606, the filter 409 filters the logarithmic signal at line 417 to produce an energy estimate of the signal at line 229. The process ends at step 607.

Figure 7:
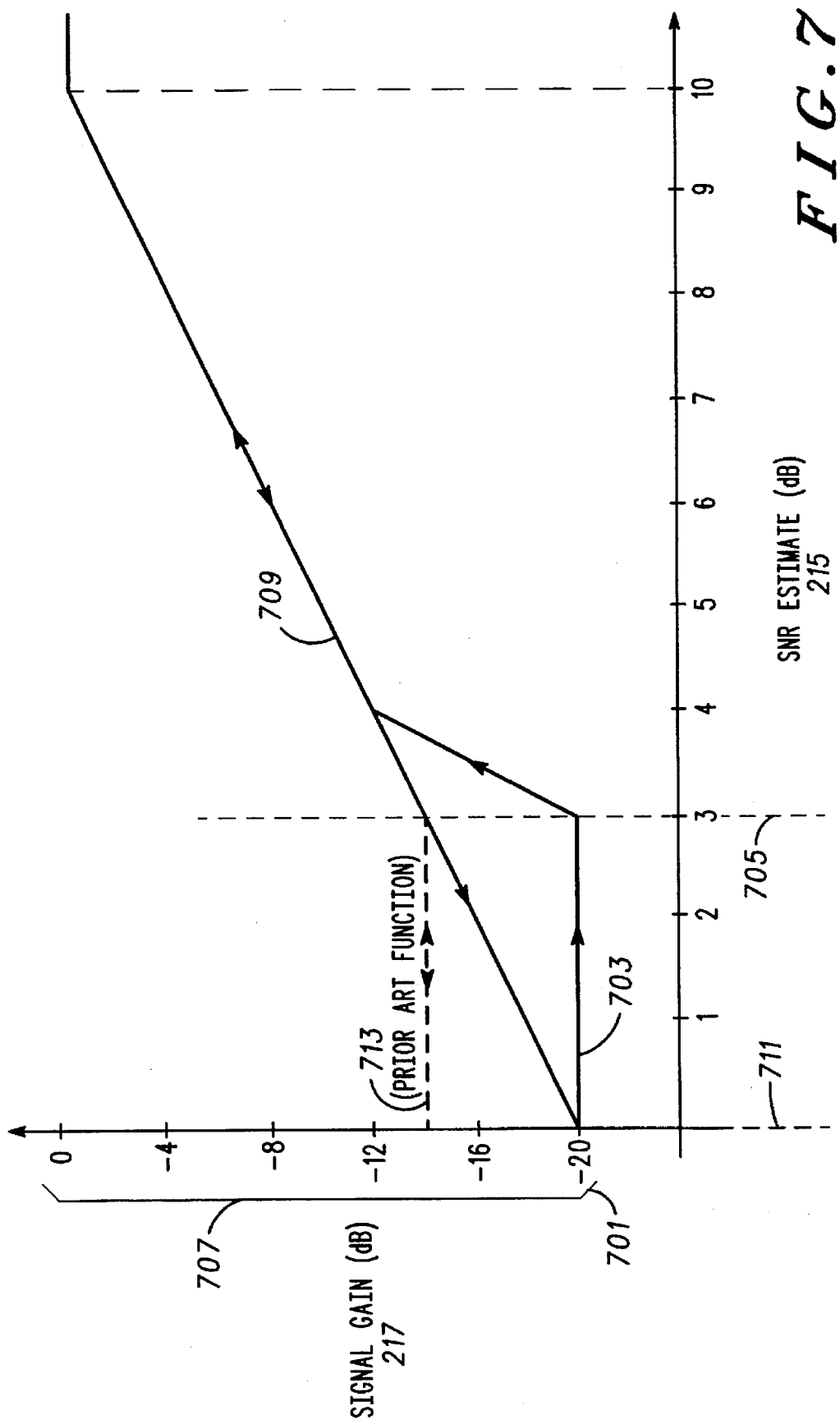
FIG. 7 illustrates a graph of a signal gain produced by a signal gain calculator of the noise suppression system of FIG. 2 responsive to a signal to noise ratio (SNR) estimate produced by a SNR estimator of the noise suppression system FIG. 2 in accordance with the present invention.

FIG. 7 illustrates a graph of a signal gain 217 produced by the signal gain calculator 205 of the noise suppression system 105 of FIG. 2 responsive to a signal to noise ratio (SNR) estimate 215 produced by the SNR estimator 227 of the noise suppression system 105 FIG. 2 in accordance with the present invention. The signal gain calculator 205, operatively coupled to the signal estimator 203, calculates a plurality of constant gain values 701 corresponding to the plurality of divided signals at line 211 according to a first function 703 responsive to the plurality of noise energy estimates at line 213, respectively, and the plurality of SNR estimates at line 215, respectively, until the plurality of SNR estimates at line 215, respectively, reach a first predetermined SNR threshold 705. Then the signal gain calculator 205 calculates a plurality of variable gain values 707 corresponding to the plurality of divided signals at line 211 according to a second function 709 responsive to the plurality of noise energy estimates at line 213, respectively, and the plurality of SNR estimates at line 215, respectively, until the plurality of SNR estimates at line 215, respectively, reach a second predetermined SNR threshold 711 below the first predetermined SNR threshold 705. Then the signal gain calculator 205 calculates the plurality of constant gain values 701 according to the first function 703 responsive to the plurality of the noise energy estimates at line 213, respectively, and the plurality of the SNR estimates at line 215, respectively, when the plurality of the SNR estimates at line 215, respectively, reach the second predetermined SNR threshold 711.

The plurality of constant gain values 701 calculated according to the first function 703 are less than the plurality of variable gain values 707 calculated according to the second function 709, respectively, when the plurality of SNR estimates at line 215, respectively, are between the first predetermined SNR threshold 705 and the second predetermined SNR threshold 711.

The signal gain 217 is preferably limited to be less than or equal to zero.

The signal gain (G) at line 217 of the second function 709 produced by the signal gain calculator 205 is preferably represented by the following equation:

$$G = \hat{N} - 2 * SNR$$

The signal gain (G) at line 217 of the first function 703 produced by the signal gain calculator 205 is preferably represented by the following equation:

$$G = \hat{N}$$

The signal gain calculator 205 advantageously overcomes the tradeoff between voice quality and noise suppression introduced by U.S. Pat. No. 4,811,404. The signal gain calculator 205 of the present invention has the first function 703, the second function 709, the first threshold 705 and the second threshold 711 to determine the signal gain 217 as shown in FIG. 7. The signal gain calculator 240 of U.S. Pat. No. 4,811,404 has two functions Group A or Group B and a constant gain, wherein the constant gain is prior to one threshold at 2.25 dB SNR estimate as shown in FIG. 3 of U.S. Pat. No. 4,811,404. The constant gain function of the U.S. Pat. No. 4,811,404 is represented by reference number 713 in FIG. 7 of the present patent application for reference purposes only. Therefore, the noise suppression system 105 of the present invention achieves maximum noise suppression, via the first function 703 below the first threshold 705, before the presence of the input signal at line 116 without degrading voice quality after the presence of the input signal at line 116 above the second threshold 711. From a practical viewpoint, the present invention has improved noise suppression than the solution disclosed in U.S. Pat. No. 4,811,404 without truncating the tail ends of speech while minimizing noise flutter. Therefore, in the present invention no compromise is necessary as was necessary in the prior art.

Figure 8:
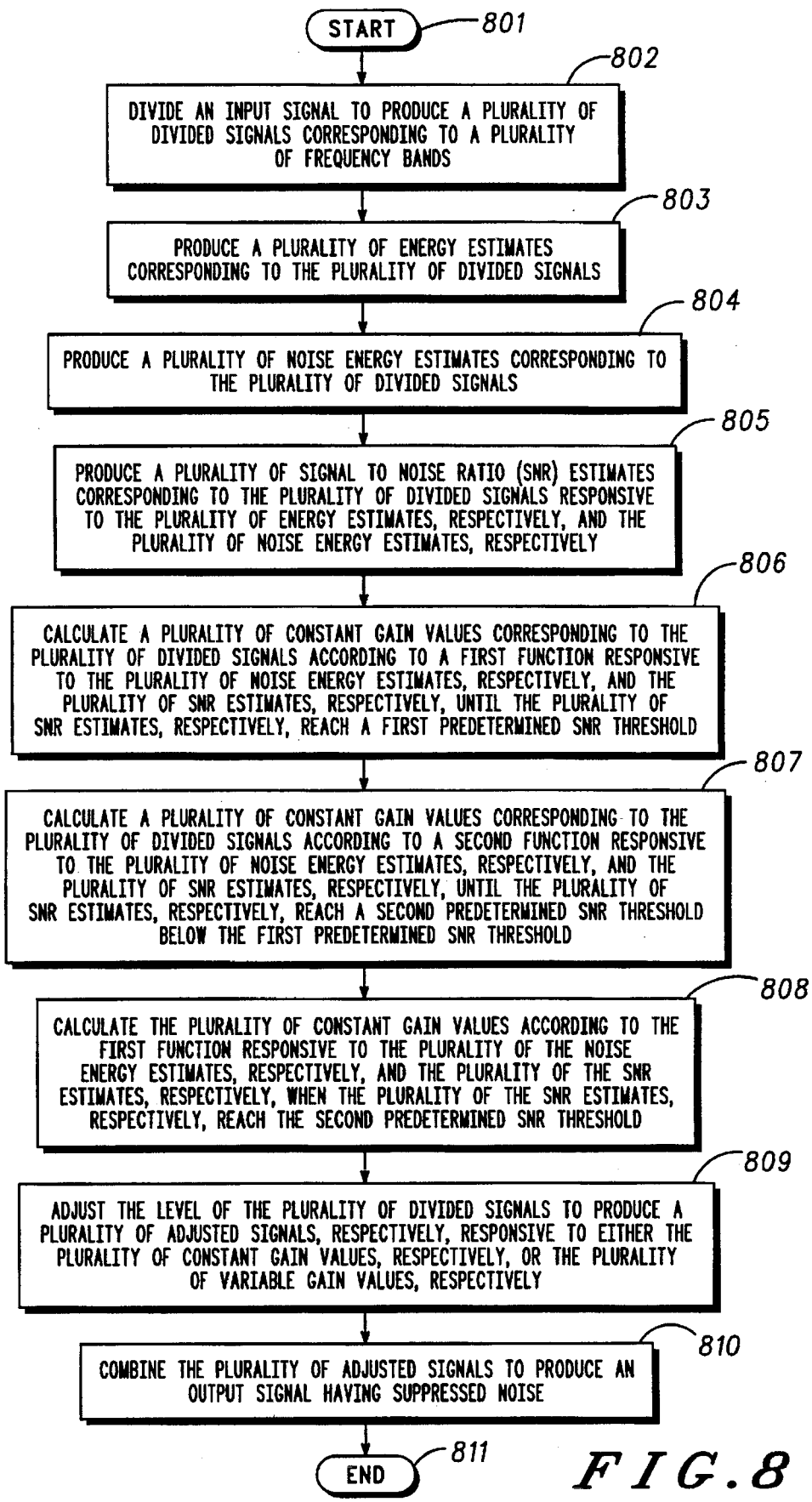
FIG. 8 illustrates a process flow diagram performed by the noise suppression system of FIG. 2 in accordance with the present invention.

FIG. 8 illustrates a process flow diagram performed by the noise suppression system 105 of FIG. 2 in accordance with the present invention.

The process begins at step 801. At step 802, the signal divider 201 divides the input signal at line 116 to produce the plurality of divided signals at line 211 corresponding to the plurality of frequency bands 301–314;

At step 803, the energy estimator 223 produces the plurality of energy estimates at line 229 corresponding to the plurality of divided signals at line 211;

At step 804, the noise energy estimator 224 produces the plurality of noise energy estimates at line 213 corresponding to the plurality of divided signals at line 211;

At step 805, the SNR estimator 227 produces the plurality of SNR estimates at line 215 corresponding to the plurality of divided signals at line 211 responsive to the plurality of energy estimates at line 229, respectively, and the plurality of noise energy estimates at line 213, respectively;

At step 806, the signal gain calculator 205 calculates the plurality of constant gain values 701 corresponding to the plurality of divided signals at line 211 according to a first function 703 responsive to the plurality of noise energy estimates at line 213, respectively, and the plurality of SNR estimates at line 215, respectively, until the plurality of SNR estimates at line 215, respectively, reach a first predetermined SNR threshold 705.

At step 807 the signal gain calculator 205 calculates the plurality of variable gain values 707 corresponding to the plurality of divided signals at line 211 according to the second function 709 responsive to the plurality of noise energy estimates at line 215, respectively, and the plurality of SNR estimates at line 215, respectively, until the plurality of SNR estimates at line 215, respectively, reach the second predetermined SNR threshold 711 below the first predetermined SNR threshold 705.

At step 808, the signal gain calculator 205 calculates the plurality of constant gain values 701 according to the first function 703 responsive to the plurality of the noise energy estimates 213, respectively, and the plurality of the SNR estimates at line 215, respectively, when the plurality of the SNR estimates at line 215, respectively, reach the second predetermined SNR threshold 711.

At step 809, the signal level adjustor 207 adjusts the level of the plurality of divided signals at line 211 to produce the plurality of adjusted signals at line 219, respectively, responsive to either the plurality of constant gain values 701, respectively, or the plurality of variable gain values 707, respectively.

At step 810, the signal combiner 209 combines the plurality of adjusted signals at line 219 to produce an output signal at line 221 having suppressed noise.

What is claimed is:

1. An energy estimator further comprising:
   a full wave rectifier, operatively coupled to receive a signal, for rectifying the signal to produce a full wave rectified signal;
   an averager, operatively coupled to the full wave rectifier, for averaging the full wave rectified signal over a predetermined time period to produce an averaged signal;
   a logarithmic function determiner, operatively coupled to the averager, for producing a logarithmic signal responsive to applying a logarithmic function to the averaged signal; and
   a filter, operatively coupled to the logarithmic function determiner, for filtering the logarithmic signal to produce an energy estimate of the signal.

2. An energy estimator according to claim 1 further comprising:
   a decimator, operatively coupled to receive the signal, for decimating the signal to produce a decimated signal;
   wherein the full wave rectifier, operatively coupled to the decimator, rectifies the decimated signal to produce the full wave rectified signal.

3. A method for estimating energy of a signal comprising the steps of:

rectifying the signal to produce a full wave rectified signal;

averaging the full wave rectified signal over a predetermined time period to produce an averaged signal;

applying a logarithmic function to the averaged signal to produce a logarithmic signal; and filtering the logarithmic signal to produce an energy estimate of the signal.

4. A method for estimating energy of a signal according to claim 3 further comprising the step of:

decimating the signal to produce a decimated signal;

wherein the decimated signal is rectified to produce the full wave rectified signal.

* * * * *